(12) United States Patent
Okazaki et al.

(10) Patent No.: US 7,551,004 B2
(45) Date of Patent: Jun. 23, 2009

(54) INVERTER APPARATUS WITH IMPROVED GATE DRIVE FOR POWER MOSFET

(75) Inventors: Yoshimi Okazaki, Kanagawa-ken (JP);
Kiyoshi Mori, Kanagawa-ken (JP);
Hiroyuki Yamazaki, Kanagawa-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 11/337,595

(22) Filed: Jan. 24, 2006

(65) Prior Publication Data

US 2006/0192589 A1    Aug. 31, 2006

(30) Foreign Application Priority Data

Feb. 25, 2005    (JP)    ............................. 2005-051267

(51) Int. Cl.
*H03K 3/00*    (2006.01)
(52) U.S. Cl. ..................... 327/108; 527/112; 527/427
(58) Field of Classification Search .......... 327/108–112
See application file for complete search history.

(56) References Cited

U.S. PATENT DOCUMENTS

| 3,828,208 | A |  | 8/1974 | Kelleher | 327/109 |
|---|---|---|---|---|---|
| 3,947,727 | A |  | 3/1976 | Stewart | 361/91.5 |
| 5,408,150 | A | * | 4/1995 | Wilcox | 327/108 |
| 5,525,925 | A | * | 6/1996 | Bayer | 327/377 |
| 7,166,968 | B2 | * | 1/2007 | Janning | 315/185 R |
| 7,183,575 | B2 | * | 2/2007 | Shimoida et al. | 257/77 |
| 7,184,281 | B2 | * | 2/2007 | Ren et al. | 363/24 |
| 2003/0107905 | A1 | * | 6/2003 | Miura et al. | 363/41 |
| 2003/0137858 | A1 | * | 7/2003 | Tsuji et al. | 363/132 |
| 2004/0251951 | A1 |  | 12/2004 | Beck | 327/427 |
| 2006/0164867 | A1 | * | 7/2006 | Dikken et al. | 363/13 |
| 2008/0290927 | A1 | * | 11/2008 | Mazzola et al. | 327/424 |

FOREIGN PATENT DOCUMENTS

| EP | 0 486 359 A1 | 5/1992 |
|---|---|---|
| JP | 10-313242 A | 11/1998 |
| JP | 2002-223157 A | 8/2002 |

* cited by examiner

*Primary Examiner*—Tuan T Lam
*Assistant Examiner*—Hiep Nguyen
(74) *Attorney, Agent, or Firm*—Birch, Stewart, Kolasch & Birch, LLP

(57) ABSTRACT

An inverter apparatus is composed of a power MOSFET having a source/drain connected to an output terminal, and a gate drive circuit driving a gate of the power MOSFET. The gate drive circuit includes a discharging path connected with the gate of the power MOSFET. The discharging path includes a set of serially-connected diodes which are forward-connected in a direction of a discharge current from the gate of the power MOSFET.

7 Claims, 5 Drawing Sheets

US 7,551,004 B2

INVERTER APPARATUS WITH IMPROVED GATE DRIVE FOR POWER MOSFET

BACKGROUND OF THE INVENTION

1. Field of the Invention

The present invention relates to an inverter apparatus, and in particular, relates to a technique for optimally driving gates of power MOSFETs (Metal Oxide Semiconductor Field Effect Transistors) within an inverter apparatus.

2. Description of the Related Art

A gate drive circuit that drives gates of power MOSFETs within an inverter apparatus typically includes a charge circuit and a discharge circuit. The charge circuit is used to charge and pull up the gates of the power MOSFETs, and the discharge circuit is used to discharge and pull down the gates.

In a typical inverter configuration, a resistance element and a diode are serially connected along a charging/discharging path between a charge/discharge circuit and a gate of a power MOSFET. The resistance element is used to adjust the time constant of the charge/discharge operation, while the diode is provided to prevent the charge/discharge current from flowing back. Control of the time constant of the charge/discharge operation is important to provide a desired on-time and off-time for the power MOSFET and to thereby adjust a dead time optimally. For example, Japanese Laid Open Patent Application No. JP-A-Heisei 10-313242 discloses an inverter apparatus having a resistance element and a diode serially connected along a path used for charging a gate of a power MOSFET, and also having a resistance element along a path used for discharging the gate. Further, Japanese Laid Open Patent Application JP-P2002-223157A discloses an inverter apparatus having a resonance inductor and a diode serially connected along a path through which a gate is discharged.

One requirement on the inverter apparatus is the control of EMI (electromagnetic interference). One cause of the EMI is resonance between a drain-source capacitance of the power MOSFET and an interconnection inductance, which may occur when the power MOSFET is turned off. Such resonance undesirably develops a resonance current of a high frequency, generating significant EMI. A description is given below on a resonance between the drain-source capacitance and the interconnection inductance With reference to FIG. 1, which shows a typical configuration of an output stage of an inverter apparatus, the resonance between the drain-source capacitance and the interconnection inductance is related to recovery currents of body diodes 103 and 104, which are incorporated in power MOSFETs 101 and 102. For example, a case is considered where the power MOSFET 101 is switched from the on-state to the off-state, and the power MOSFET 102 is switched from the off-state to the on-state thereafter. When the power MOSFET 102 is switched to the on-state after the power MOSFET 101 is switched to the off-state, the body diode 103 exhibits reverse recovery, and a recovery current flows through the body diode 103. The recovery current causes the resonance between the drain-source capacitance of the power MOSFET 101 and the inductance of an interconnection connected to the power MOSFET 101, leading to the flow of the resonance current of a high frequency.

There is a need for a technique that reduces the EMI caused by the resonance between the drain-source capacitance of the power MOSFET and the interconnection inductance.

SUMMARY OF THE INVENTION

Therefore, an object of the present invention is to provide an inverter apparatus that effectively reduces EMI caused by resonance between a drain-source capacitance of a power MOSFET and an inductance of an interconnection connected to the power MOSFET.

In an aspect of the present invention, an inverter apparatus is composed of a power MOSFET having a source/drain connected to an output terminal; and a gate drive circuit driving a gate of the power MOSFET. The gate drive circuit includes a discharging path connected with the gate of the power MOSFET. The discharging path includes a set of serially-connected diodes which are forward-connected in a direction of a discharge current from the gate of the power MOSFET.

Preferably, the serially-connected diodes are silicon diodes.

In another aspect of the present invention, an inverter apparatus is composed of: a first power MOSFET having a source/drain connected to an output terminal; a second power MOSFET having a source/drain connected to the output terminal; a first gate drive circuit driving a gate of the first power MOSFET; and a second gate drive circuit driving a gate of the second power MOSFET. During pull-down of the gate of the first power MOSFET followed by pull-up of the gate of the second power MOSFET, the first gate drive circuit drives the gate of the first power MOSFET so that a gate-source voltage of the first power MOSFET ranges from 30% to 70% of a threshold voltage of the first power MOSFET at a timing when the second gate drive circuit drives a gate-source voltage of the second power MOSFET to a threshold voltage of the second power MOSFET.

Preferably, the gate-source voltage of the first power MOSFET ranges from 40% to 60% of the threshold voltage of the first power MOSFET at the timing when the second gate drive circuit drives the gate-source voltage of the second power MOSFET to the threshold voltage of the second power MOSFET.

In still another aspect of the present invention, an operating method is provided for an inverter apparatus including first and second power MOSFETs, the first power MOSFET having a first source/drain connected with a first power terminal and a second source/drain connected with an output terminal, and the second power MOSFET having a first source/drain connected with a second power terminal, and a second source/drain connected with the output terminal. The operating method includes:

pulling down a gate of the first power MOSFET to turn off the first power MOSFET; and pulling up a gate of the second power MOSFET to turn on the second power MOSFET.

The gate-source voltage of the first power MOSFET ranges from 30% to 70% of a threshold voltage of the first power MOSFET at a timing when a gate-source voltage of the second power MOSFET is driven to a threshold voltage of the second power MOSFET during the pulling up of the gate of the second power MOSFET.

DETAILED DESCRIPTION OF THE INVENTION

Figure 1:
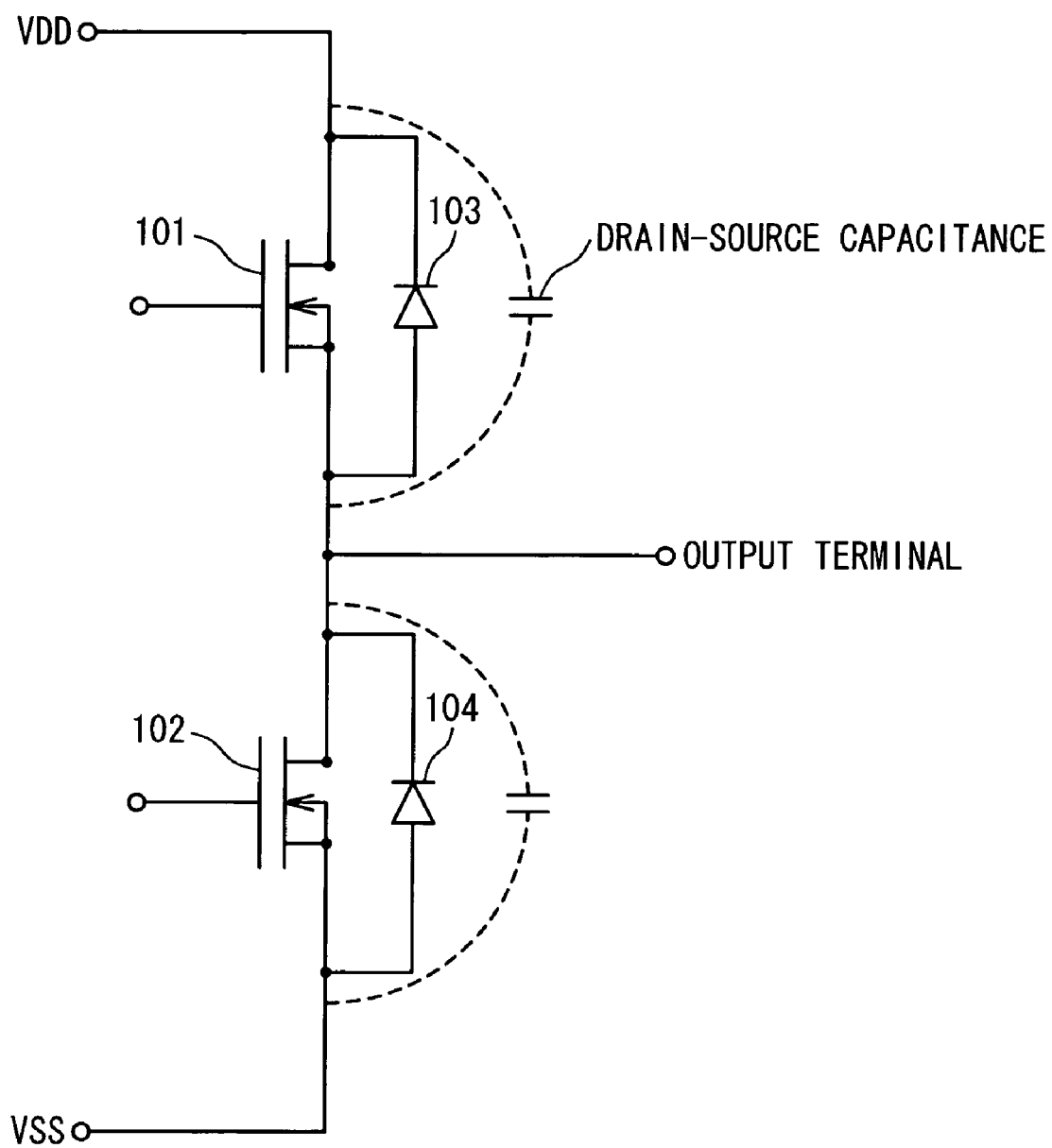
FIG. 1 is a circuit diagram showing a typical configuration of an output stage within a three-phase inverter.
Figure 2:
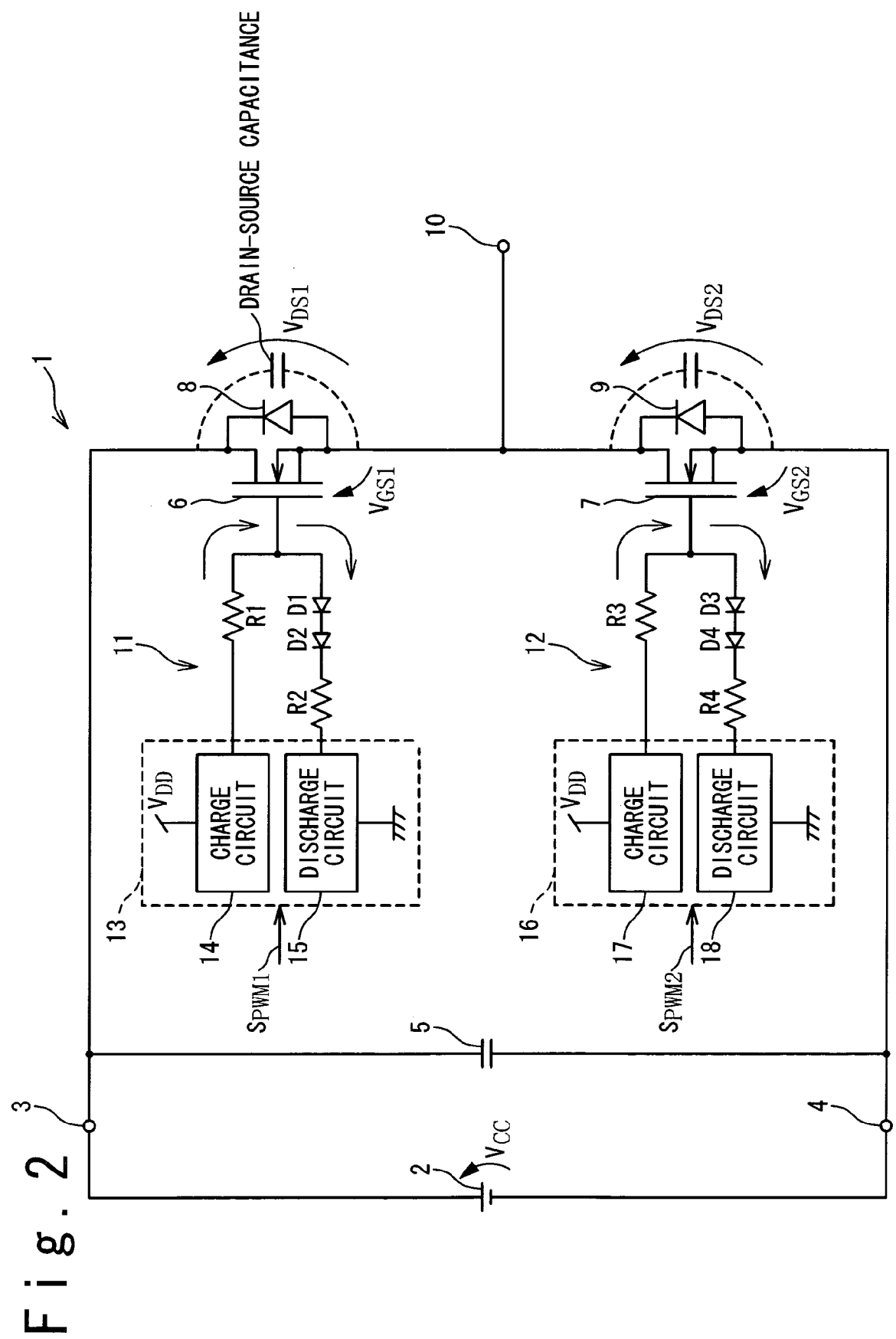
FIG. 2 is a circuit diagram showing a configuration of a three-phase inverter in an embodiment of the present invention.

FIG. 2 is a circuit diagram showing a configuration of a three-phase inverter 1 in an embodiment of the present invention. It should be noted that FIG. 2 shows only a portion corresponding to a U-phase in an output stage that outputs a three-phase alternating current; portions corresponding to other phases (V phase and W phase), which are not shown in FIG. 2, also have the same configuration.

The three-phase inverter 1 is provided with a positive electrode terminal 3 connected to a cathode of a battery 2; a negative electrode terminal 4 connected to an anode of the battery 2; a smoothing capacitor 5 connected between the positive electrode terminal 3 and the negative electrode terminal 4; and N-channel power MOSFETs 6 and 7. In one embodiment, a power supply voltage $V_{CC}$ generated by the battery 2 is about 48 V. The power MOSFET 6 is used to pull up an output terminal 10 through which a U-phase voltage is outputted, while the power MOSFET 7 is used to pull down the output terminal 10. More specifically, the power MOSFET 6 has a drain connected to the positive electrode terminal 3, and a source connected to the output terminal 10. On the other hand, the power MOSFET 7 has a drain connected to the output terminal 10, and a source connected to the negative electrode terminal 4. The power MOSFET 6 and 7 incorporate body diodes 8 and 9, respectively.

The three-phase inverter 1 is further provided with gate drive circuits 11 and 12 for driving gates of the power MOSFETs 6 and 7, respectively.

The gate drive circuit 11 is provided with a control circuit 13, resistance elements R1 and R2; and diodes D1 and D2. The control circuit 13 is responsive to the PWM signal $S_{PWM1}$ received from a control device to perform PWM control; the control circuit 13 switches on and off the power MOSFET 6. The control circuit 13 includes a charge circuit 14 and a discharge circuit 15. The charge circuit 14 charges the gate of the power MOSFET 6 up to a power supply level $V_{DD}$ through the resistance element R1, and thereby turns on the power MOSFET 6. On the other hand, the discharge circuit 15 discharges the gate of the power MOSFET 6 down to a ground level $V_{SS}$ through the resistance element R2, the diodes D1 and D2, and thereby turns off the power MOSFET 6. The diodes D1 and D2 are serially connected in a forward direction with respect to a discharge current flowing from the gate of the power MOSFET 6 to a ground terminal.

The gate drive circuit 12, which drives the gate of the power MOSFET 7, has the same configuration as that of the gate drive circuit 11. The gate drive circuit 12 is provided with a control circuit 16, resistance elements R3 and R4; and diodes D3 and D4. The control circuit 16 switches on and off the power MOSFET 7 in response to a PWM signal $S_{WPM2}$. The control circuit 16 has a charge circuit 17 and a discharge circuit 18. The charge circuit 17 charges the gate of the power MOSFET 7 up to the power supply level $V_{DD}$ through the resistance element R3, and thereby turns on the power MOSFET 7. On the other hand, the discharge circuit 18 discharges the gate of the power MOSFET 7 down to the ground level $V_{SS}$ through the resistance element R4, the diodes D3 and D4, and thereby turns off the power MOSFET 7. The diodes D3 and D4 are serially connected in a forward direction with respect to a discharge current flowing from the gate of the power MOSFET 7 to the ground terminal.

One important feature of the three-phase inverter 1 shown in FIG. 2 is that a plurality of diodes are provided along the paths through which the gates of the power MOSFETs 6 and 7 are discharged. The diodes D1 and D2 are serially connected in a forward direction along the path through which the gate of the power MOSFET 6 is discharged. Correspondingly, the diodes D3 and D4 are serially connected in a forward direction along the path through which the gate of the power MOSFET 7 is discharged.

These diodes provide a function of maintaining gate-source voltages of the power MOSFET 6 and 7 at voltages slightly higher than 0 V, for a certain period of time after the power MOSFETs 6 and 7 are turned off. For example, a gate-source voltage $V_{GS1}$ of the power MOSFET 6 is higher than the sum of forward voltages $V_F$ of the diodes D1 and D2 as long as the discharge current flows therethrough for discharging the gate of the power MOSFET 6. More specifically, when both the diodes D1 and D2 are silicon diodes, the gate-source voltage $V_{GS1}$ of the power MOSFET 6 is maintained at 0.9 V or above as long as the discharge current flows therethrough. The same applies to a gate-source voltage $VGS_2$ of the power MOSFET 7.

It is effective to maintain the gate-source voltages to the voltages slightly higher than 0 V after the turn-off of the power MOSFETs 6 and 7 for reducing EMI caused by resonance between the drain-source capacitance and the interconnection inductance. Maintaining the gate-source voltages to the voltages slightly higher than 0 V effectively reduces the drain-source capacitances of the power MOSFETs 6 and 7 when the power MOSFETs 6 and 7 are turned off. Reduction of the drain-source capacitance decreases undesired high-frequency currents through the power MOSFETs 6 and 7, and effectively reduces the EMI caused by the resonance between the drain-source capacitance and the interconnection inductance.

Figure 3:
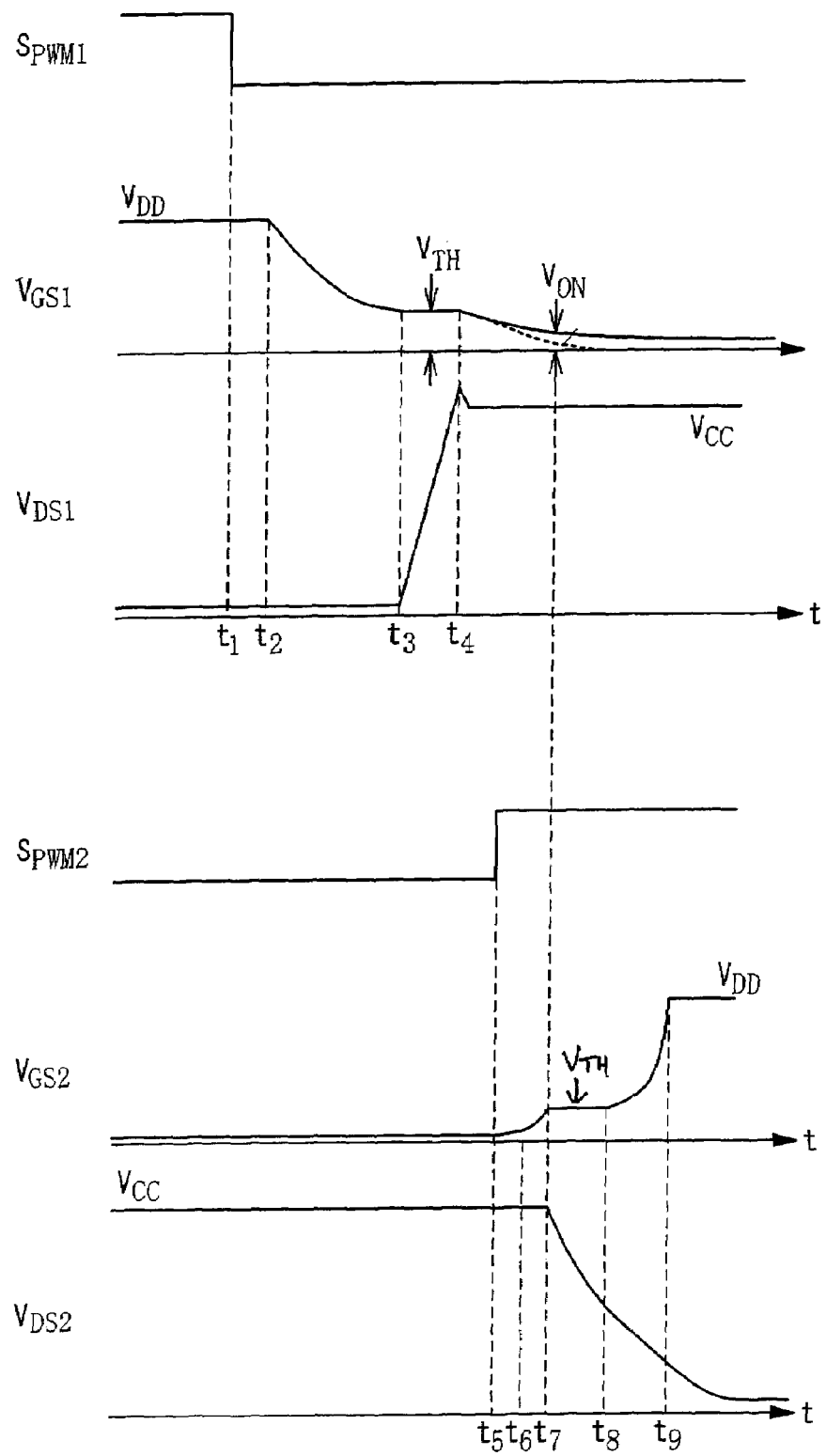
FIG. 3 is a timing chart showing an operation of a three-phase inverter shown in FIG. 2.

With reference to FIG. 3 a detailed description is made of an operation of the three-phase inverter 1, in particular, of the effect of the plurality of diodes provided along the paths through which the gates of the power MOSFETs 6 and 7 are discharged during operations of the three-phase inverter 1.

FIG. 3 is a timing chart showing the operation of the three-phase inverter 1, in which the power MOSFET 6 is turned off, and the power MOSFET 7 is turned on subsequently. Initially, the power MOSFET 6 has a gate-source voltage $V_{GS1}$ of $V_{DD}-V_{SS}$ (approximately equal to $V_{DD}$), and the power MOSFET 6 is turned on. In this state, the drain-source voltage $V_{DS1}$ of the power MOSFET 6 is the product of the drain current through the power MOSFET 6 multiplied by an on-resistance thereof.

On the other hand, the gate-source voltage $V_{GS2}$ of the power MOSFET 7 is approximately close to a sum of the forward voltages $V_F$ of the diodes D3 and D4, and the power MOSFET 7 is turned off. In this state, the drain-source voltage $V_{DS2}$ of the power MOSFET 6 is substantially identical to the power supply voltage $V_{CC}$ supplied from the battery 2 to the three-phase inverter 1.

In response to the pull-down of the PWM signal $S_{PWM1}$ to the "Low" level at a time $t_1$, the discharge circuit 15 of the gate drive circuit 11 initiates discharging the gate of the power MOSFET 6 at a time $t_2$. As a result, the gate-source voltage $V_{GS1}$ of the power MOSFET 6 is pulled down to a threshold voltage $V_{TH}$ of the power MOSFET 6 at a time t3. When the gate-source voltage $V_{GS1}$ of the power MOSFET 6 reaches the threshold voltage $V_{TH}$, the power MOSFET 6 is turned off, and the drain-source voltage $V_{DS1}$ begins to increase. After the power MOSFET 6 is turned off, the gate-source voltage $V_{GS1}$ is maintained at the threshold voltage $V_{TH}$ for a certain period of time. In FIG. 3, the gate-source voltage $V_{GS1}$ is maintained constant between the times $t_3$ and $t_4$.

Subsequently, the gate-source voltage $V_{GS1}$ is pulled down from the threshold voltage $V_{TH}$ to 0 V at the time $t_4$. It should be noted that the gate-source voltage $V_{GS1}$ is gradually reduced, owing to the plurality of the diodes D1 and D2 provided along the path through which the gate of the power MOSFET 6 is discharged. In FIG. 3, a solid line indicates a change in the gate-source voltage $V_{GS1}$ in the three-phase inverter 1 of the embodiment, while a dashed line indicates a change in the gate-source voltage $V_{GS1}$ in the case where only a single diode is provided along the path used for discharging the gate of the power MOSFET 6. The gate-source voltage $V_{GS1}$ is maintained at the double or above of the forward voltage $V_F$ of the diodes D1 and D2 as long as the discharge current continues to flow.

The power MOSFET 7 is turned on after the power MOSFET 6 is turned off. In detail, in response to the pull-up of the PWM signal $S_{PWM2}$ to the "High" level at a time $t_5$, the charge circuit 17 of the gate drive circuit 12 initiates charging the gate of the power MOSFET 7 at a time $t_6$. As a result, the gate-source voltage $V_{GS2}$ of the power MOSFET 7 is increased up to the threshold voltage $V_{TH}$ of the power MOSFET 7, and the power MOSFET 7 is turned on at a time $t_7$. In response to the turn-on of the power MOSFET 7, the drain-source voltage $V_{DS2}$ thereof is pulled down to the product of the drain current through the power MOSFET 7 multiplied by the on-resistance thereof. The gate-source voltage $V_{GS2}$ of the power MOSFET 7 is pulled up to the voltage $V_{DD}-V_{SS}$, after being maintained at the threshold voltage $V_{TH}$ for a certain period of time. In FIG. 3, the gate-source voltage $V_{GS2}$ is maintained at the threshold voltage $V_{TH}$ between the times $t_7$ and $t_8$.

It is important that the off-state gate-source voltage $V_{GS1}$ of the power MOSFET 6 is maintained sufficiently higher than 0 V when the power MOSFET 7 is turned on (namely, at the time $t_7$ when the gate-source voltage $V_{GS2}$ of the power MOSFET 7 reaches the threshold voltage $V_{TH}$). At the time $t_7$ when the power MOSFET 7 is turned on, a recovery current causing the resonance begins to flow through the body diode 8 of the power MOSFET 6. Therefore, the reduction of the drain-source capacitance of the power MOSFET 6 at the time t7 is important to reduce the EMI. Accordingly, it is effective to maintain the gate-source voltage VGS1 of the power MOSFET 6 at the time $t_7$, to a value sufficiently higher than 0 V.

The gate-source voltage $V_{GS1}$ of the power MOSFET 6 at the time $t_7$ preferably is about a half of the threshold voltage $V_{TH}$ of the power MOSFET 6, more specifically in a range of 30% to 70% of the threshold voltage $V_{TH}$. More preferably, the gate-source voltage $V_{GS1}$ of the power MOSFET 6 at the time $t_7$ is in a range of 40% to 60% of the threshold voltage $V_{TH}$ of the power MOSFET 6. If the gate-source voltage $V_{GS1}$ of the power MOSFET 6 at the time $t_7$ is excessively low, the drain-source capacitance is not sufficiently reduced. On the other hand, if the gate-source voltage $V_{GS1}$ of the power MOSFET 6 at the time $t_7$ is excessively high, the power MOSFET 6 is not sufficiently turned off.

The gate-source voltage $V_{GS1}$ of the power MOSFET 6 at the time $t_7$ may be adjusted with the number and/or kinds of diodes provided along the paths through which the gates of the power MOSFETs 6 and 7 are discharged. It is preferable that the diodes D1 to D4 are silicon diodes in order to sufficiently increase the gate-source voltage $V_{GS1}$ of the power MOSFET 6 at the time $t_7$ with a reduced number of diodes. The silicon diode essentially has a high forward voltage, and the use of the silicon diodes therefore allows sufficiently increasing the gate-source voltage $V_{GS1}$ of the power MOSFET 6 at the time $t_7$, with a reduced number of diodes.

Figure 4:
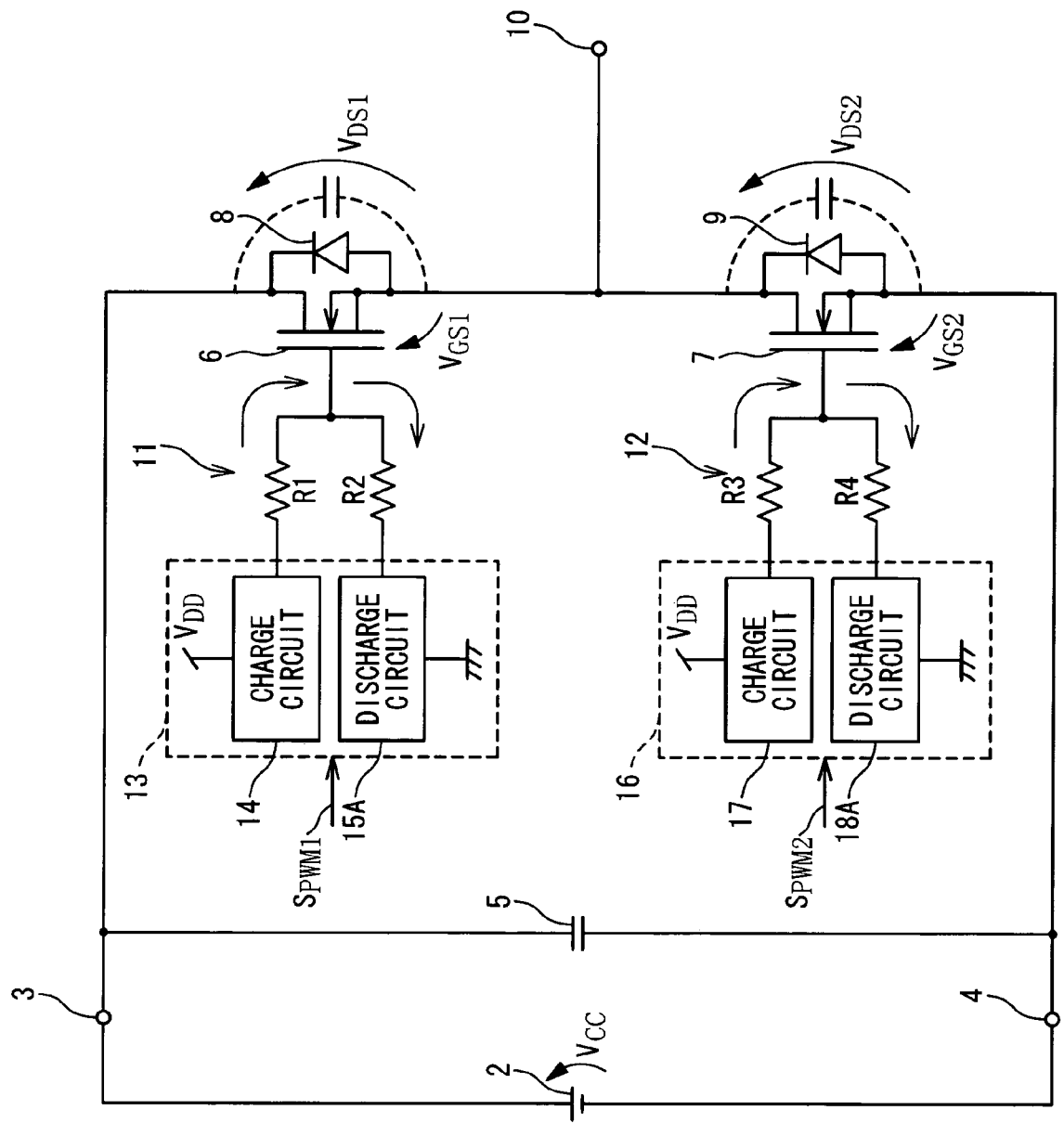
FIG. 4 is a circuit diagram showing a configuration of a three-phase inverter in another embodiment of the present invention.

Although FIG. 3 only shows the operation in which the power MOSFET 7 is turned on after the power MOSFET 6 is turned off, it is obvious for those skilled in the art that an operation for turning on the power MOSFET 6 after the turn-off of the power MOSFET 7 is also performed in the same way FIG. 4 is a block diagram showing a configuration of a three-phase inverter 1A in another embodiment. In the embodiment, discharge circuits 15A and 18A are designed to maintain gate-source voltages of power MOSFETs 6 and 7 at certain voltages after the turn-off of the power MOSFETs 6 and 7, instead of providing a plurality of diodes to paths where the gates of the power MOSFETs 6 and 7 are discharged.

The discharge circuits 15A and 18A are configured to maintain the gate-source voltages of the power MOSFETs 6 and 7 at approximately the half of a threshold voltage $V_{TH}$ after the turn-offs of the power MOSFETs 6 and 7. More specifically, the discharge circuits 15A and 18A are configured to maintain the gate-source voltages of the power MOSFETs 6 and 7 at voltages in a range of 30% to 70% of the threshold voltage $V_{TH}$ after the turn-offs of the power MOSFETs 6 and 7. More preferably, the discharge circuits 15A and 18A are configured to maintain the gate-source voltages of the power MOSFETs 6 and 7 at voltages in a range of 40% to 60% of the threshold voltage $V_{TH}$.

Figure 5:
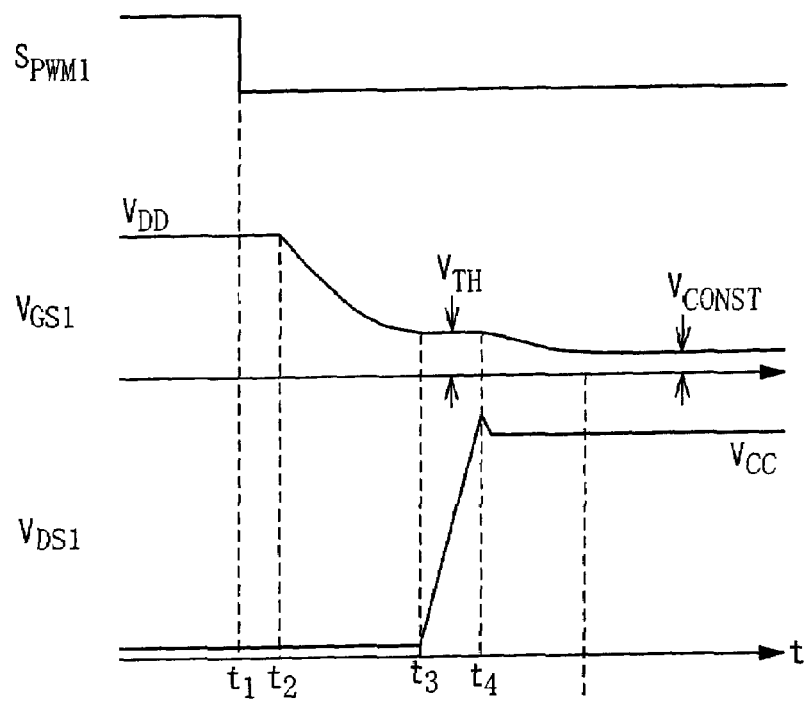
FIG. 5 is a timing chart showing an operation of a three-phase inverter shown in FIG. 4.
Figure 5:
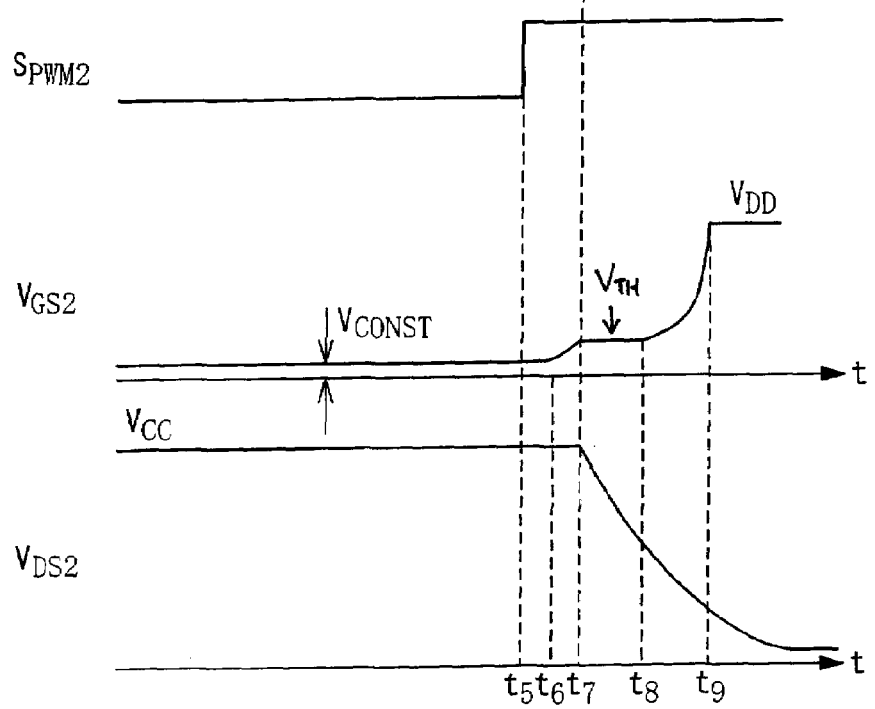

FIG. 5 is a timing chart showing an exemplary operation of the three-phase inverter 1A shown in FIG. 4, in which the power MOSFET 7 is turned on after the power MOSFET 6 is turned off. The difference from the operation shown in FIG. 3 is that the discharge circuit 15A pulls down the gate of the power MOSFET 6 to a certain positive potential level $V_A$ after the power MOSFET 6 is turned off; the gate of the power MOSFET 6 is not pulled down to the ground level $V_{SS}$. Consequently, the discharge circuit 15A maintains a gate-source voltage $V_{GS1}$ at a voltage $V_{CONST}(=V_A-V_{SS})$ or above, at all times. The potential level $V_A$ is selected so that the voltage $V_{CONST}$ is adjusted to approximately half of the threshold voltage $V_{TH}$, and more specifically, to a level in a range of 30% to 70% of the threshold voltage $V_{TH}$. In other words, the turn-off gate-source voltage $V_{GS1}$ of the power MOSFET 6 is maintained in a range of 30% to 70% of the threshold voltage $V_{TH}$, and the drain-source capacitance is consequently reduced. As stated above, the reduction of the drain-source capacitance is effective to reduce the EMI. More preferably, the voltage $V_{CONST}$ is adjusted to be in a range of 40% to 60% of the threshold voltage $V_{TH}$.

Although FIG. 5 only shows an operation in which the power MOSFET 7 is turned on after the power MOSFET 6 is turned off, it is obvious for those skilled in the art that an operation in which the power MOSFET 6 is turned on after the turn-off of the power MOSFET 7 is also performed in the same way.

As explained above, the three-phase inverter in the embodiments is designed so that the gate-source voltage of the power MOSFET is gradually lowered after the turn-off thereof, or is maintained at a voltage approximately the half of the threshold voltage $V_{TH}$. Consequently, the off-state drain-source capacitance of the power MOSFET is effectively reduced. The reduction of the drain-source capacitance of the power MOSFET is effective to reduce the EMI caused by the resonance between the drain-source capacitance and the interconnection inductance.

It is apparent that the present invention is not limited to the above-described embodiments, which may be modified and changed without departing from the scope of the invention.

What is claimed is:

1. An inverter apparatus, comprising:
a first power MOSFET having a source/drain connected to an output terminal;
a second power MOSFET having a source/drain connected to said output terminal;
a first gate drive circuit driving a gate of said first power MOSFET; and
a second gate drive circuit driving a gate of said second power MOSFET; wherein, said first gate drive circuit includes,
a first discharging path connected with said gate of said first power MOSFET, said first discharging path including a set of first serially-connected diodes which are forward-connected in a direction of a first discharge current from said gate of said first power MOSFET,
said second gate drive circuit includes,
a second discharging path connected with said gate of said second power MOSFET, said second discharging path comprising a set of second serially-connected diodes which are forward-connected in a direction of a second discharge current from said gate of said second power MOSFET, and
during pull-down of said gate of said first power MOSFET followed by pull-up of said gate of said second power MOSFET, said first gate drive circuit drives said gate of said first power MOSFET so that when said second gate drive circuit drives a gate-source voltage of said second power MOSFET to a threshold voltage of said second power MOSFET, a gate-source voltage of said first power MOSFET is always higher than 0V and lower than a threshold voltage of said first power MOSFET.

2. The inverter apparatus according to claim 1, wherein said gate-source voltage of said first power MOSFET ranges from 30% to 70% of said threshold voltage of said first power MOSFET at said timing when said second gate drive circuit drives said gate-source voltage of said second power MOSFET to said threshold voltage of said second power MOSFET.

3. An operating method of an inverter apparatus including:
a first power MOSFET having a first source/drain connected with a first power terminal, and a second source/drain connected wit an output terminal; and
a second power MOSFET having a first source/drain connected with a second power terminal, and a second source/drain connected with said output terminal,
said method comprising:
pulling down a gate of said first power MOSFET to turn off said first power MOSFET; and
pulling up a gate of said second power MOSFET to turn on said second power MOSFET, wherein
a first discharging pat connects with said gate of said first power MOSFET and includes a set of first serially-connected diodes which are forward-connected in a direction of a first discharge current from said gate of said first power MOSFET,
a second discharging path connects with said gate of said second power MOSFET and includes a set of second serially-connected diodes which are forward-connected in a direction of a second discharge current from said gate of said second power MOSFET, and
when a gate-source voltage of said second power MOSFET is driven to a threshold voltage of said second power MOSFET during said pulling up of said gate of said second power MOSFET, a gate-source voltage of said first power MOSFET is always higher than 0V and lower than a threshold voltage of said first power MOSFET.

4. The inverter apparatus according to claim 1, wherein said gate-source voltage of said first power MOSFET ranges from 40% to 60% of said threshold voltage of said first power MOSFET at said timing when said second gate drive circuit drives said gate-source voltage of said second power MOSFET to said threshold voltage of said second power MOSFET.

5. The operating method according to claim 3, wherein said gate-source voltage of said first power MOSFET ranges from 30% to 70% of said threshold voltage of said first power MOSFET at said timing when said gate-source voltage of said second power MOSFET is driven to said threshold voltage of said second power MOSFET during said pulling up of said gate of said second power MOSFET.

6. The operating method according to claim 1 wherein the gate-source voltage of said first power MOSFET is maintained higher than 0V and lower than said threshold voltage of said first power MOSFET even after said second power MOSFET is turned on.

7. The inverter apparatus according to claim 1, wherein
said first power MOSFET is connected between a positive electrode terminal and said output terminal, and said second power MOSFET is connected between a negative electrode terminal and said output terminal, and
said gate-source voltage of said first power MOSFET is maintained higher than 0V and lower than said threshold voltage of said first power MOSFET by said first serially-connected diodes even after said second power MOSFET is turned on.

* * * * *